(12) United States Patent
Lin

(10) Patent No.: US 11,251,238 B2
(45) Date of Patent: Feb. 15, 2022

(54) DISPLAY DEVICE AND MANUFACTURING METHOD THEREFOR

(71) Applicant: BOE TECHNOLOGY GROUP CO., LTD., Beijing (CN)

(72) Inventor: Chuni Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 580 days.

(21) Appl. No.: 16/305,825

(22) PCT Filed: Feb. 12, 2018

(86) PCT No.: PCT/CN2018/076474
§ 371 (c)(1),
(2) Date: Nov. 29, 2018

(87) PCT Pub. No.: WO2019/007077
PCT Pub. Date: Jan. 10, 2019

(65) Prior Publication Data
US 2021/0225946 A1 Jul. 22, 2021

(30) Foreign Application Priority Data
Jul. 7, 2017 (CN) .......................... 201710551731.9

(51) Int. Cl.
*H01L 27/32* (2006.01)
*G06F 3/041* (2006.01)
*H01L 51/52* (2006.01)

(52) U.S. Cl.
CPC .......... *H01L 27/323* (2013.01); *G06F 3/0412* (2013.01); *H01L 27/3276* (2013.01);
(Continued)

(58) Field of Classification Search
CPC ...... B82Y 20/00; G02B 6/1225; G02B 1/005; H01S 5/11; G02F 2202/32; H01L 27/323;
(Continued)

(56) References Cited

U.S. PATENT DOCUMENTS 8,643,532 B1 * 2/2014 Puscasu ................. G01J 3/108
342/4
10,386,947 B2 * 8/2019 Liu ................... G02F 1/136286
(Continued)

FOREIGN PATENT DOCUMENTS

CN   102645789 A   8/2012
CN   103941908 A   7/2014
(Continued)

OTHER PUBLICATIONS

Machine translation, Zhang, Chinese Pat. Pub. No. CN 105607334A, translation date: May 9, 2021, Espacenet, all pages. (Year: 2021).*
(Continued)

*Primary Examiner* — Victoria K. Hall
(74) *Attorney, Agent, or Firm* — Kinney & Lange, P.A.

(57) ABSTRACT

Disclosed are a display device and a manufacturing method therefor. The display device comprises a touch trace and a photonic crystal structure provided in a common layer, wherein an orthographic projection of the photonic crystal structure on a substrate is overlapped with an orthographic projection of a pixel light emitting unit on the substrate.

17 Claims, 10 Drawing Sheets

(52) U.S. Cl.
CPC .............. *H01L 51/5284* (2013.01); *G06F 2203/04103* (2013.01); *H01L 2227/323* (2013.01)

(58) Field of Classification Search
CPC ............ H01L 51/5275; H01L 51/5262; H01L 51/5268
See application file for complete search history.

(56) References Cited

U.S. PATENT DOCUMENTS

| | | | | |
|---|---|---|---|---|
| 2003/0218704 | A1* | 11/2003 | Lee | B82Y 20/00 349/106 |
| 2011/0102715 | A1* | 5/2011 | Park | G02F 1/133514 349/106 |
| 2011/0149214 | A1* | 6/2011 | Yoon | G02F 1/133514 349/106 |
| 2014/0176413 | A1* | 6/2014 | Jung | G02F 1/1335 345/102 |
| 2015/0115226 | A1* | 4/2015 | Scire | H01L 27/3276 257/40 |
| 2015/0177859 | A1* | 6/2015 | Zhou | G06F 3/0412 349/12 |
| 2016/0365392 | A1* | 12/2016 | Li | H01L 27/3232 |
| 2017/0045984 | A1* | 2/2017 | Lu | G06F 3/0443 |
| 2017/0336662 | A1* | 11/2017 | Zhang | G02F 1/1368 |
| 2018/0286926 | A1* | 10/2018 | Kim | H01L 27/323 |
| 2018/0348923 | A1* | 12/2018 | Liu | G02F 1/136286 |
| 2018/0350883 | A1* | 12/2018 | Lee | G06F 3/0443 |
| 2018/0364153 | A1* | 12/2018 | Carr | G01J 5/12 |
| 2019/0013497 | A1* | 1/2019 | So | H01L 51/5056 |
| 2019/0094978 | A1* | 3/2019 | Feng | G02F 1/13338 |
| 2020/0160023 | A1* | 5/2020 | Hu | G02F 1/13725 |
| 2020/0241692 | A1* | 7/2020 | Zhang | G06F 3/0428 |

FOREIGN PATENT DOCUMENTS

| | | | | |
|---|---|---|---|---|
| CN | 104201188 A | | 12/2014 | |
| CN | 105093679 A | * | 11/2015 | ......... G02F 1/13357 |
| CN | 105093679 A | | 11/2015 | |
| CN | 105572955 A | * | 5/2016 | ....... G02F 1/136286 |
| CN | 105572955 A | | 5/2016 | |
| CN | 105607334 A | * | 5/2016 | .......... G02F 1/1335 |
| CN | 106406617 A | * | 2/2017 | .......... G06F 3/0412 |
| CN | 107359180 A | | 11/2017 | |
| WO | WO-2017036016 A1 | * | 3/2017 | ....... G02F 1/136209 |

OTHER PUBLICATIONS

Machine translation, Liu, Chinese Pat. Pub. No. CN 105093679B, translation date: Jun. 8, 2021, Espacenet, all pages. (Year: 2021).*
International Search Report and English Translation of the Box V of the Written Opinion dated Apr. 13, 2018, received for corresponding Chinese Application No. PCT/CN2018/076474.
Third Chinese Office Action dated May 13, 2019, received for corresponding Chinese Application No. 201710551731.9.

* cited by examiner

DISPLAY DEVICE AND MANUFACTURING METHOD THEREFOR

CROSS REFERENCE TO RELATED APPLICATIONS

The present application is the national phase of PCT Application No. PCT/CN2018/076474 filed on Feb. 12, 2018, which in turn claims a priority to Chinese Patent Application No. 201710551731.9, filed on Jul. 7, 2017, with a title of "Display device and manufacturing method therefor", the entirety of which is incorporated herein by reference.

TECHNICAL FIELD

The present disclosure relates to, but is not limited to, the technical field of display, and particularly to a display device and a manufacturing method therefor.

BACKGROUND

With technology development and upgrading of display devices, organic electroluminance display devices (OLEDs) have become mainstream products in the display field. OLEDs can be classified into a bottom emitting type and a top emitting type depending on the light output manner. A light is output from the substrate side in a bottom emitting type OLED, while a light is output from the top in a top emitting type OLED.

A full colorization of a large size OLED is generally achieved by stacking a top emitting type light emitting diode (LED) and a color film layer.

SUMMARY

The embodiments of the present disclosure provide a display device, comprising: a touch trace and a photonic crystal structure provided in a common layer, wherein an orthographic projection of the photonic crystal structure on a substrate is overlapped with an orthographic projection of a pixel light emitting unit on the substrate.

Optionally, in the display device as described above, the photonic crystal structure comprises periodically arranged photonic crystal units; at least one photonic crystal unit comprises a plurality of different photonic crystal patterns; and the photonic crystal patterns are configured such that at least one photonic crystal pattern forms a monochromatic light in a specific wavelength range upon a light emitted from the pixel light emitting unit passes through the at least one photonic crystal pattern.

Optionally, in the display device as described above, the photonic crystal patterns in the at least one photonic crystal unit comprise convex pillar structures or concave pillar structures arranged in different periods.

Optionally, in the display device as described above, the at least one photonic crystal unit has three kinds of photonic crystal patterns with different patterns for forming monochromatic lights with a red color, a green color and a blue color respectively.

Optionally, in the display device as described above, the touch trace is provided around one or more photonic crystal units or around a plurality of photonic crystal patterns.

Optionally, in the display device as described above, the pixel light emitting unit comprises a first electrode layer, an organic light emitting layer and a second electrode layer arranged in this order.

Optionally, in the display device as described above, the touch trace and the photonic crystal structure are positioned in a transparent conductive layer, and the transparent conductive layer is on a side of the pixel light emitting unit away from the substrate.

Optionally, in the display device as described above, a black matrix is provided on a side of the transparent conductive layer away from the substrate, said black matrix being positioned between two adjacent photonic crystal patterns.

Optionally, in the display device as described above, the pixel light emitting unit is positioned in a pixel definition layer, and a thin film encapsulation layer is provided between the pixel definition layer and the transparent conductive layer.

Optionally, the display device as described above is a top emitting touch display.

The embodiments of the present disclosure further provide a method for manufacturing a display device, comprising:

forming a pixel light emitting unit; and forming a touch trace and a photonic crystal structure via one masking process, wherein an orthographic projection of the photonic crystal structure on the substrate is overlapped with an orthographic projection of the pixel light emitting unit on the substrate.

Optionally, in the method for manufacturing a display device as described above, the pixel light emitting unit is positioned in a pixel definition layer, and said forming the touch trace and the photonic crystal structure via one masking process comprises:

forming a thin film encapsulation layer and a transparent conductive layer sequentially on the pixel definition layer and the pixel light emitting unit; and forming the touch trace and the photonic crystal structure by treating the transparent conductive layer via one masking treatment using a grey tone masking plate, wherein the touch trace is around one or more photonic crystal units or around a plurality of photonic crystal patterns in the photonic crystal structure.

Optionally, in the method for manufacturing a display device as described above, the touch trace and the photonic crystal structure are formed on a transparent conductive layer, and the method further comprises:

forming a black matrix on the transparent conductive layer, said black matrix being positioned between two adjacent photonic crystal patterns.

BRIEF DESCRIPTION OF DRAWINGS

The drawings are used to provide further understandings of the technical solutions of the present disclosure, and form a part of the description. The drawings together with the embodiments of the present disclosure are used to explain, but not to limit the technical solutions of the present disclosure.

DETAILED DESCRIPTION

In a top emitting type touch display in related art, touch traces for touch operations and a color film layer are manufactured through multiple manufacture procedures. In actual manufacture, the color film layer and the touch traces are formed on an encapsulation layer of an organic electroluminance (EL) layer through multiple manufacture procedures. Such manufacturing process is complex, and may cause loss to the organic EL layer, thereby lowering the manufacturing yield of the display. In addition, the touch traces in related art are usually externally connected traces, and it is required to create a special space for disposing the touch traces in the display, which will increase the thickness and weight of the display, influence the appearance and size of the display, and reduce the market competitiveness of the display.

The embodiments of the present disclosure provide a display device and a manufacturing method therefor, to at least partially solve the following problems of the top emitting type touch display in related art: because multiple manufacture procedures are required for manufacturing a color film and touch traces, the manufacturing process is complex, and it may cause loss to the organic EL layer, thereby reducing the manufacturing yield of the display; and because the touch traces are externally connected traces, the thickness and weight of the display are increased, and the appearance and size of the display are influenced.

In order to make the objects, technical solutions and advantages of the present disclosure more clear and apparent, the embodiments of the present disclosure will be described in detail below with reference to the drawings. It should be noted that, unless contradiction, the embodiments of the present disclosure and the features in the embodiments can be combined with each other arbitrarily.

The following particular embodiments provided in the present disclosure can be combined with each other, and the same or similar concept or procedure may not be reiterated in certain embodiments.

Figure 1:
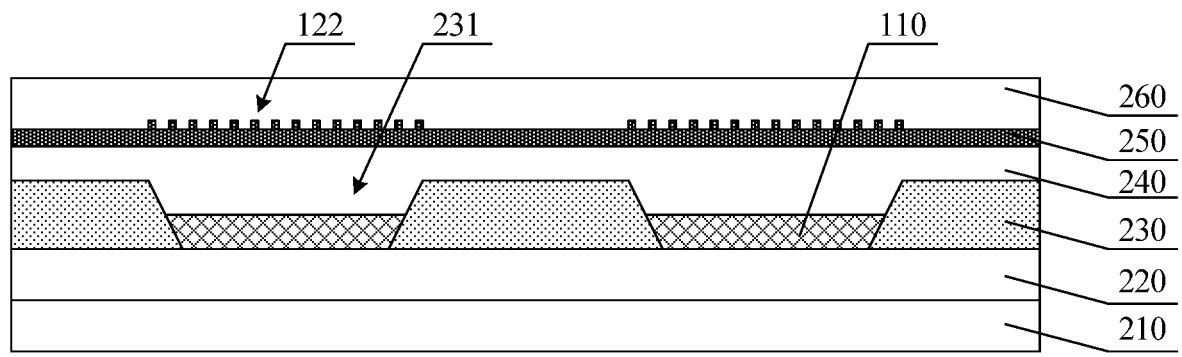
FIG. 1 is a structural schematic diagram of a display device provided in an embodiment of the present disclosure.
Figure 2:
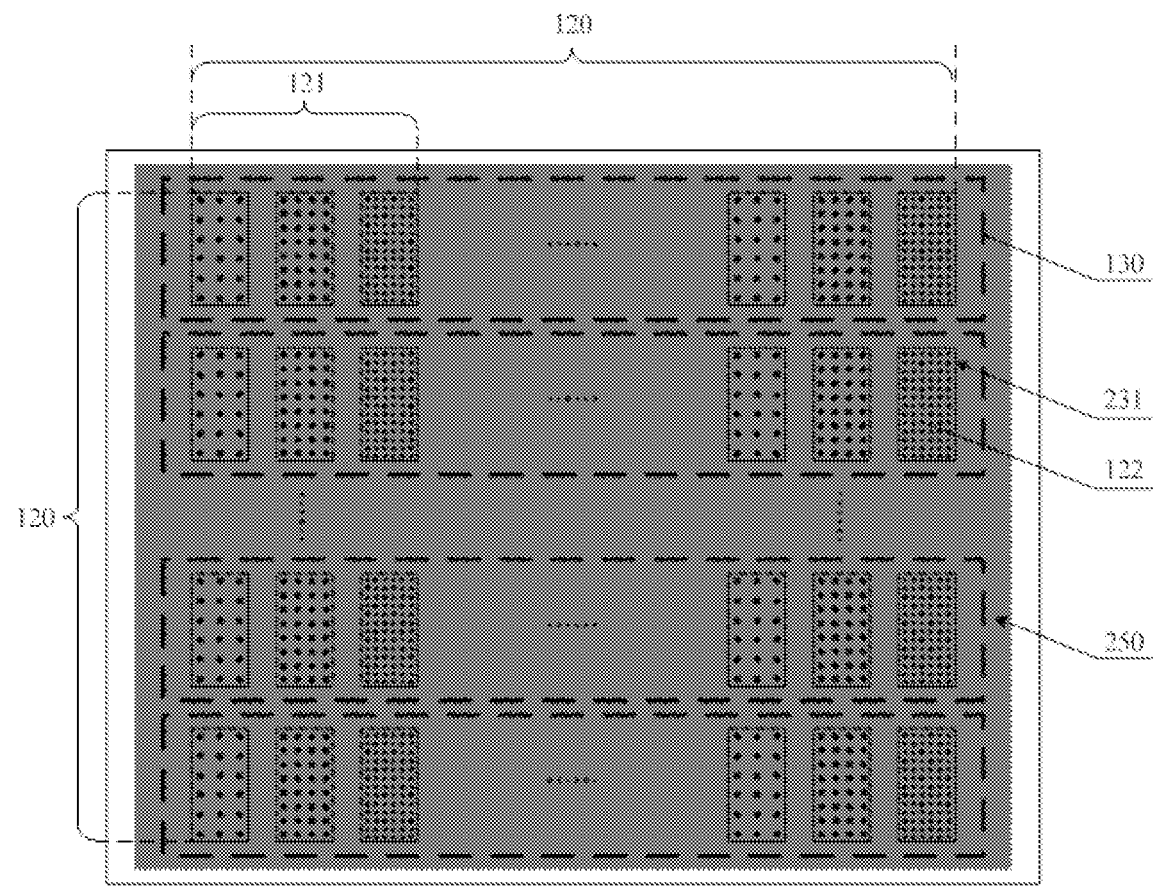
FIG. 2 is a top view of a display device provided in an embodiment of the present disclosure.

FIG. 1 is a structural schematic diagram of a display device provided in an embodiment of the present disclosure, and FIG. 2 is a top view of one structure of the display device. The display device provided in the embodiment is, for example, a top emitting display device. The display device may comprise touch traces 130 and a photonic crystal structure 120 provided in a common layer, wherein an orthographic projection of the photonic crystal structure 120 on a substrate 210 is overlapped with an orthographic projection of a pixel light emitting unit 110 on the substrate 210. Also, the display device may further comprise a pixel definition layer (PDL) 230 and a pixel definition region 231 in which the pixel light emitting unit 110 is located. It should be noted that FIG. 1 is only a part of the structure of the display device, showing a plurality of photonic crystal patterns 122 in the photonic crystal structure 120.

In the embodiment of the present disclosure, a plurality of pixel definition regions 231 are provided in the pixel definition layer 230, each of the pixel definition regions 231 may be a hole, and one pixel light emitting unit 110 is provided in each of the pixel definition regions 231.

In practical application, the touch traces 130 and the photonic crystal structure 120 may be provided in a transparent conductive layer (TCL) 250 (FIG. 2 shows one arrangement manner of the touch traces 130 and the photonic crystal structure 120 in the transparent conductive layer 250).

In the embodiment of the present disclosure, the display device comprises the substrate 210, and a thin film transistor array (TFT array) layer 220 is provided between the pixel definition layer (PDL) 230 and the substrate 210; the pixel light emitting unit 110 is located in the PDL 230; a thin film encapsulation (TFE) layer 240 is provided on a side of the PDL 230 away from the substrate 210 (i.e., between the transparent conductive layer 250 and the PDL 230); and a protective layer 260, for example, a hard coat, is further provided on a side of the transparent conductive layer 250 away from the substrate 210. FIG. 1 shows a sectional view of the display device.

In the display device in the embodiment of the present disclosure, pixel definition regions 231 are provided in the PDL 230. The pixel definition regions 231 may be formed by subjecting the PDL 230 (for example, formed by an applying process) to a masking treatment. After the plurality of pixel definition regions 231 in the PDL 230 are formed, one pixel light emitting unit 110 is formed in each of the pixel definition regions 231. These pixel light emitting units 110 are used to emit photons and the photons transmit through the photonic crystal structure 120 of the display device.

In the embodiment of the present disclosure, an orthographic projection of the photonic crystal structure 120 on the substrate 210 is overlapped with an orthographic projection of the pixel light emitting unit 110 on the substrate 210. It should be noted that the photonic crystal structure 120 is an integral structure of the pixel layer in the display device. The photonic crystal structure 120 comprises a plurality of photonic crystal units 121, and each of the photonic crystal units 121 is a pixel. Each of the photonic crystal units 121 comprises a plurality of photonic crystal patterns 122, and each of the photonic crystal patterns 122 is a sub-pixel. Based on the relationship among the photonic crystal structure 120, the photonic crystal units 121, and the photonic crystal patterns 122 as described above, in the display device in the embodiments of the present disclosure, each pixel light emitting unit 110 corresponds to one photonic crystal pattern 122. It can be seen from FIG. 1 that there is a photonic crystal pattern 122 correspondingly provided on a side of each pixel light emitting unit 110 away from the substrate, and the pixel light emitting unit 110 and the photonic crystal pattern 122 may be in a one to one correspondence. The "correspondence" between the photonic crystal pattern 122 and the pixel light emitting unit 110 herein means that an orthographic projection of the photonic crystal pattern 122 on the substrate 210 is overlapped with an orthographic projection of the pixel light emitting unit 110 on the substrate 210, and "one to one correspondence" means that an orthographic projection of each photonic crystal pattern 122 on the substrate 210 is overlapped with an orthographic projection of each pixel light emitting unit 110 on the substrate 210, or an orthographic projection of each photonic crystal pattern 122 on the substrate 210 covers an orthographic projection of each pixel light emitting unit 110 on the substrate 210. In addition, the display device has the touch traces 130 provided in the same layer as the photonic crystal structure 120, and the touch traces 130 are traces (wires) for achieving user's touch function. FIG. 2 is a top view of a display device provided in an embodiment of the present disclosure. It can be seen that the touch traces 130 and the photonic crystal structure 120 are disposed in the same layer (for example, in the transparent conductive layer 250) of the display device, and the touch traces 130 may be provided around the photonic crystal units 121 or a plurality of photonic crystal patterns 122. FIG. 2 also shows the relationship among the photonic crystal structure 120, the photonic crystal units 121, and the photonic crystal patterns 122.

It should be noted that in the embodiment of the present disclosure, the photonic crystal structure 120 provided in the transparent conductive layer 250 is used for achieving the function of color film layer, and the transparent conductive layer 250 may be regarded as a color film layer. When a light emitted from the pixel light emitting unit 110 passes through the photonic crystal structure 120 in the transparent conductive layer 250, output lights in different wavelength ranges may be formed, i.e., monochromatic lights with different colors may be formed, after photons pass through the photonic crystal patterns 122 with different patterns, due to a filtering effect of the photonic crystal structure 120. That is, the arrangement of the photonic crystal structure 120 and the touch traces 130 in a common layer of the display device means that the color film function layer and the touch traces 130 are provided in a common layer. In addition, the photonic crystal structure 120 and the touch traces 130 may be formed by subjecting the transparent conductive layer 250 (for example, formed by a depositing process) to a masking treatment, so that the manufacture of the photonic crystal structure 120 and the touch traces 130 can be accomplished in one manufacture procedure.

In a top emitting type touch display in related art, the color film layer and the touch traces for achieving touch operations are manufactured in multiple manufacture procedures, and it is required to create a special space for disposing the touch traces in the display. In contrast, in the display device provided in the embodiments of the present disclosure, the color film function layer (i.e., the photonic crystal structure 120) and the touch traces 130 may be manufactured in one manufacture procedure. As such, multiple manufacture procedures required for manufacturing the color film function layer and the touch traces on an organic EL layer can be avoided, and the possibility of damaging the organic EL layer by the manufacture procedure can be effectively reduced, thereby obtaining a relatively high product yield. In addition, the touch traces 130 and the color film function layer (i.e., the photonic crystal structure 120) are provided in a common layer (i.e., in the transparent conductive layer 250). As such, the thickness of the overall module can be effectively reduced, and the weight of the display device can be reduced, thereby increasing the market competitiveness of the display device.

Optionally, based on the relationship among the photonic crystal structure 120, the photonic crystal units 121 and each of the photonic crystal patterns 122 as described above, in the embodiments of the present disclosure, the photonic crystal structure 120 in the transparent conductive layer 250 comprises periodically arranged photonic crystal units 121, and each of the photonic crystal units 121 has different photonic crystal patterns 122. Reference is made to the display device as shown in FIG. 2. FIG. 2 illustrates an example in which each of the photonic crystal units 121 has three kinds of photonic crystal patterns 122 with different patterns.

In the embodiments of the present disclosure, each of the photonic crystal patterns 122 is used to form a monochromatic light in a specific wavelength range after a light emitted from the pixel light emitting unit 110 passes through the photonic crystal pattern 122. In the display device as shown in FIG. 2, each of the photonic crystal units 121 has three kinds of photonic crystal patterns 122 with different patterns. That is, the photonic crystal structure 120 in the transparent conductive layer 250 is formed by repeatedly arranging these three kinds of photonic crystal patterns 122 with different patterns. For example, the three kinds of photonic crystal patterns 122 are used for forming monochromatic lights with red color, green color and blue color (RGB) respectively. As such, these photonic crystal patterns 122 are used for achieving the function of RGB layer.

Figure 3:
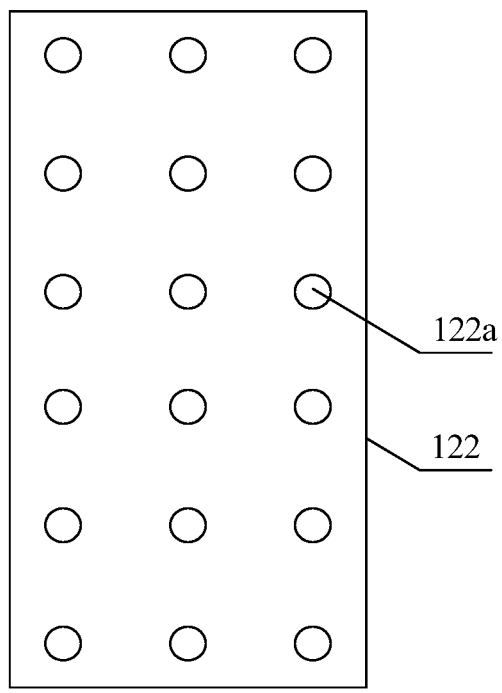
FIG. 3 is a top view of a photonic crystal pattern of a display device provided in an embodiment of the present disclosure.
Figure 4:
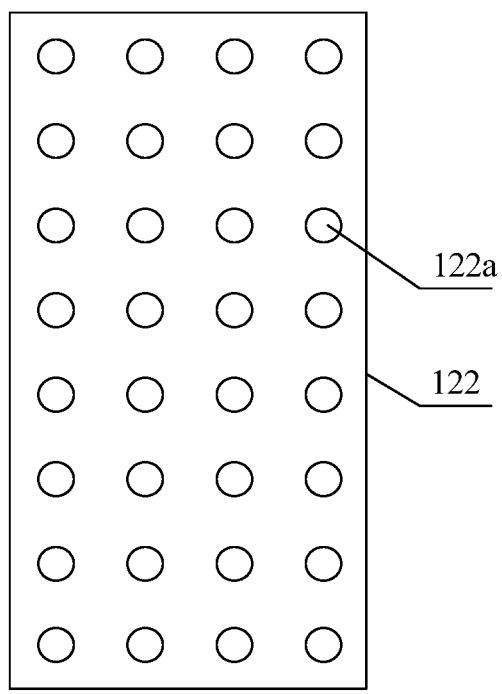
FIG. 4 is a top view of another photonic crystal pattern of a display device provided in an embodiment of the present disclosure.
Figure 5:
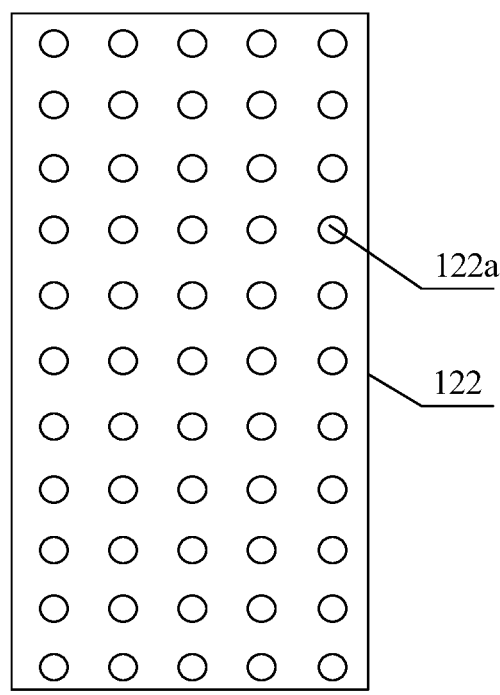
FIG. 5 is a top view of yet another photonic crystal pattern of a display device provided in an embodiment of the present disclosure.

Optionally, FIG. 3 is a top view of a photonic crystal pattern in a display device provided in an embodiment of the present disclosure; FIG. 4 is a top view of another photonic crystal pattern in a display device provided in an embodiment of the present disclosure; and FIG. 5 is a top view of yet another photonic crystal pattern in a display device provided in an embodiment of the present disclosure. It can be seen that the patterns consisted of pillar structures 122a in the different photonic crystal patterns 122 shown in FIG. 3 to FIG. 5 are different. The density of the pillar structures 122a in the photonic crystal pattern 122 as shown in FIG. 3 is the lowest, and the density of the pillar structures 122a in the photonic crystal pattern 122 as shown in FIG. 5 is the highest. The photonic crystal patterns as shown in FIG. 3 to FIG. 5 may be three kinds of different photonic crystal patterns 122 in one photonic crystal unit 121. The photonic crystal patterns 122 in each photonic crystal unit 121 comprise convex pillar structures or concave pillar structures arranged in different periods.

In the embodiments of the present disclosure, for photonic crystal patterns 122 in each photonic crystal unit 121, each photonic crystal pattern 122 in the photonic crystal unit 121 forms a monochromatic light in a wavelength range corresponding to said each photonic crystal pattern 122 upon a light emitted from the pixel light emitting unit 110 passes through the photonic crystal patterns 122 in the photonic crystal unit 121. In the embodiments of the present disclosure, photons emitted from each of the pixel light emitting unit 110 are usually the same. After the photons pass through different photonic crystal patterns 122 in each of the photonic crystal units 121, monochromatic lights in different wavelength ranges are formed. The monochromatic light may be a monochromatic light with red color, green color or blue color as described above. That is, different photonic crystal patterns 122 in each of the photonic crystal units 121 are used for achieving the function of RGB layer. By making use of different periodic arrangements of high- and low-refractive index materials, the embodiments of the present disclosure enable the achievement of desired red color, green color and blue color after photons pass through the different high- and low-refractive index materials. For example, indium tin oxide (ITO), a typical transparent conductive material, has a refractive index of about 1.8, while air has a refractive index of 1.0. By making use of the difference between the refractive indexes of pillar or hole-shaped ITO and air in combination with different arranging periods of the pillar or hole-shaped structures, monochromatic lights in different wavelength ranges can be formed respectively by the filtering effects.

It should be noted that in the embodiments of the present disclosure, it is not limited that each of the photonic crystal units 121 comprises only three kinds of photonic crystal patterns 122 with different structures, and it is also not limited that the photonic crystal patterns 122 are only used to form monochromatic lights with red color, green color and blue color. For example, if each of the photonic crystal units 121 comprises four kinds of photonic crystal patterns 122 with different structures, four kinds of monochromatic lights with different colors can be formed.

Optionally, in the embodiments of the present disclosure, the touch traces 130 may be configured such that each touch trace 130 is provided around the photonic crystal unit(s) 121 or around a plurality of photonic crystal patterns 122.

In one possible implementation of the present disclosure, as shown in FIG. 2, each touch trace 130 is provided around a plurality of photonic crystal units 121 arranged transversely.

Figure 6:
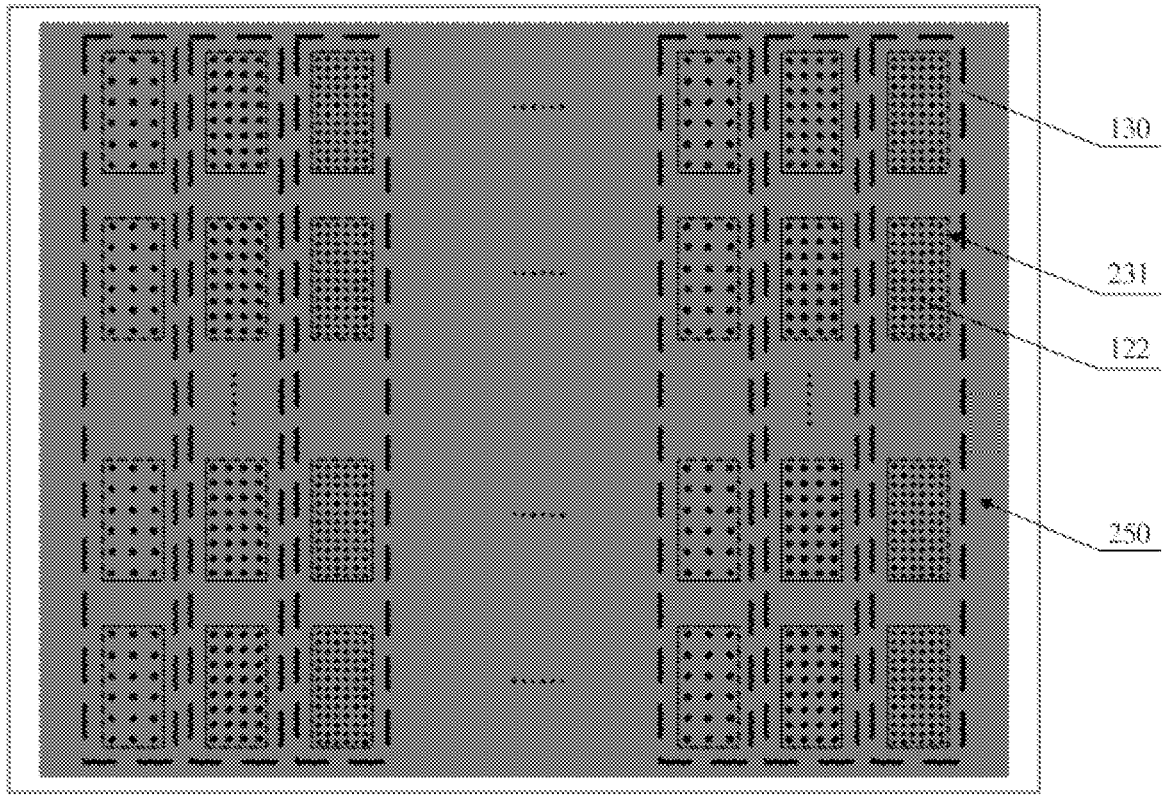
FIG. 6 is a top view of another display device provided in an embodiment of the present disclosure.

In another possible implementation of the present disclosure, as shown in FIG. 6, which is a top view of another display device provided in an embodiment of the present disclosure, each touch trace 130 in FIG. 6 is provided around a plurality of photonic crystal patterns 122 arranged vertically.

Figure 7:
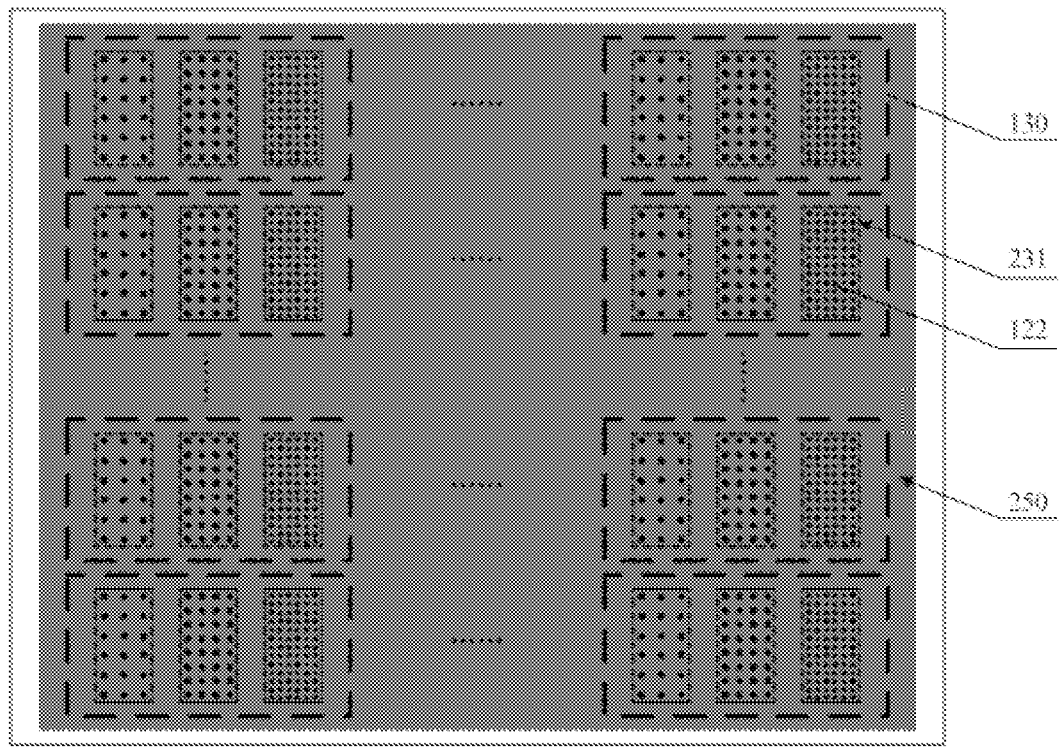
FIG. 7 is a top view of yet another display device provided in an embodiment of the present disclosure.

In another possible implementation of the present disclosure, as shown in FIG. 7, which is a top view of yet another display device provided in an embodiment of the present disclosure, each touch trace 130 in FIG. 7 is provided around each of the photonic crystal units 121.

Figure 8:
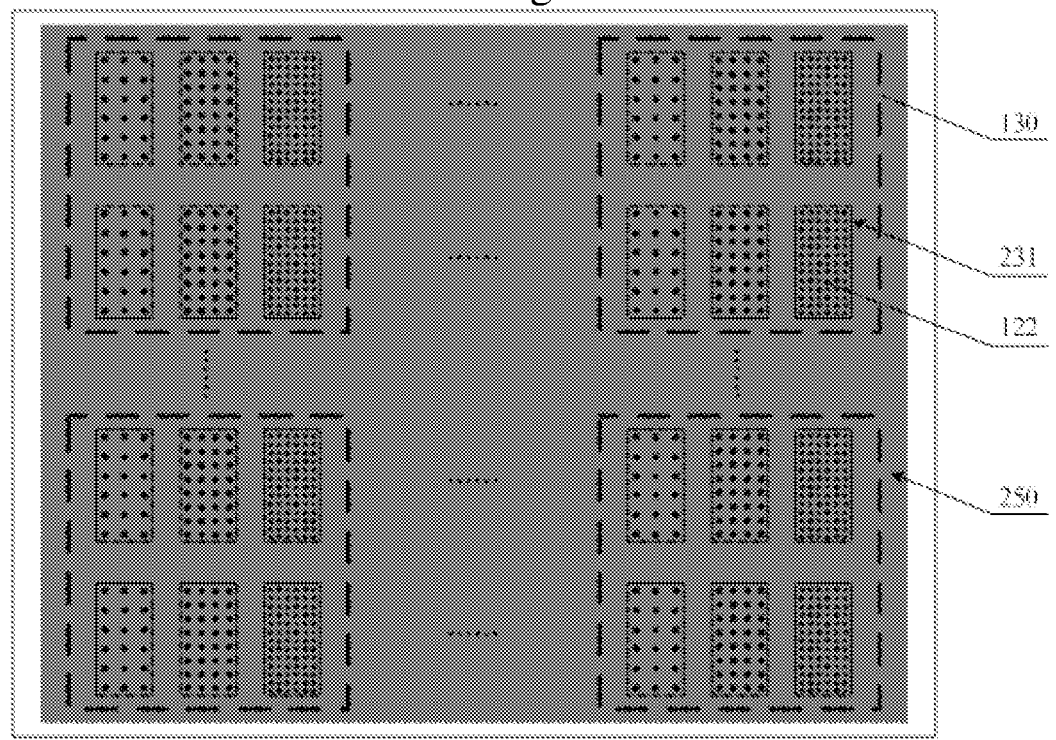
FIG. 8 is a top view of still another display device provided in an embodiment of the present disclosure.

In another possible implementation of the present disclosure, as shown in FIG. 8, which is a top view of still another display device provided in an embodiment of the present disclosure, each touch trace 130 in FIG. 8 is provided around n photonic crystal units 121 arranged vertically, that is, around n*m (n rows and m columns) photonic crystal patterns 122. In FIG. 8, n is 2 and m is 3.

It should be noted that in the embodiments of the present disclosure, configurations of the touch traces 130 are not particularly limited. The configurations of the touch traces 130 in the above FIG. 2 and FIG. 6 to FIG. 8 are only illustrative. Any configuration, as long as the touch traces 130 are provided in the transparent conductive layer 250, i.e., provided in the same layer as the photonic crystal structure 120 for achieving the function of color film layer, and can accurately identify touch operations of a user, can be used as the configuration of the touch traces 130 in the embodiments of the present disclosure.

Figure 9:
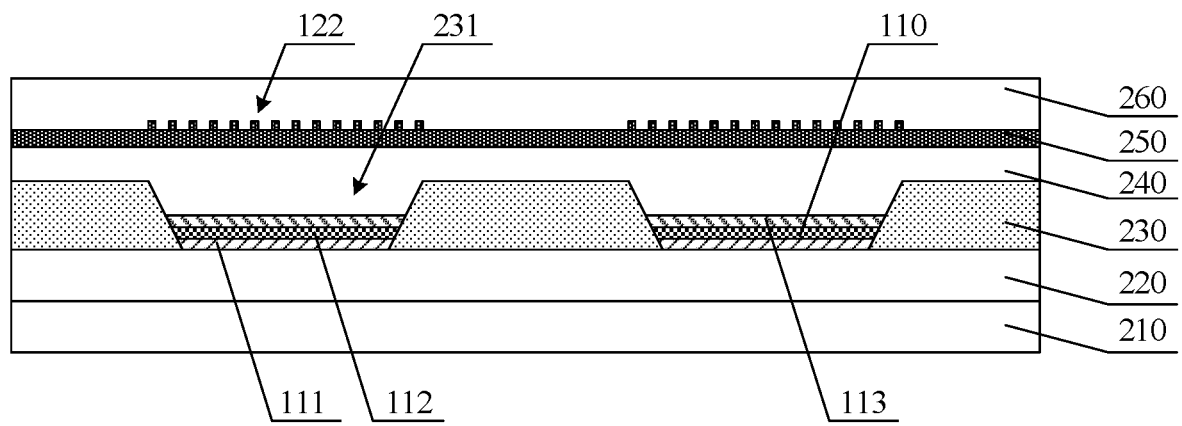
FIG. 9 is a structural schematic diagram of another display device provided in an embodiment of the present disclosure.

Optionally, FIG. 9 is a structural schematic diagram of another display device provided in an embodiment of the present disclosure. In the embodiment of the present disclosure, the pixel light emitting unit 110 in the pixel definition region 231 of the PDL 230 may comprise a first electrode layer 111, an organic light emitting layer 112 and a second electrode layer 113 which are sequentially arranged, wherein the first electrode layer is a reflecting electrode such as an anode layer, the organic light emitting layer 112 is an organic EL layer, and the second electrode layer 113 is a translucent electrode such as a cathode layer. The light emitting principle of the pixel light emitting unit 110 is that photons are emitted from the organic light emitting layer 112, reflected by the anode layer, and then output from the cathode layer.

Figure 10:
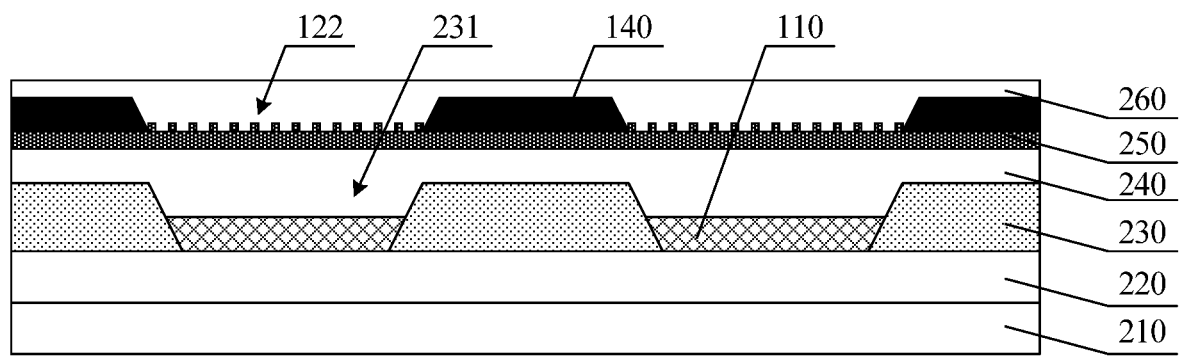
FIG. 10 is a structural schematic diagram of yet another display device provided in an embodiment of the present disclosure.

Optionally, FIG. 10 is a structural schematic diagram of yet another display device provided in an embodiment of the present disclosure. In the display device provided in the embodiment as shown in FIG. 10, on the basis of the structure of the display device as shown in FIG. 2, a black matrix 140 is provided on a side of the transparent conductive layer 250 away from the substrate, and the black matrix 140 is positioned between two adjacent photonic crystal patterns 122. A color mixing phenomenon between adjacent sub-pixels due to light leakage can be avoided by providing the black matrix 140 between two adjacent photonic crystal patterns 122.

Figure 11:
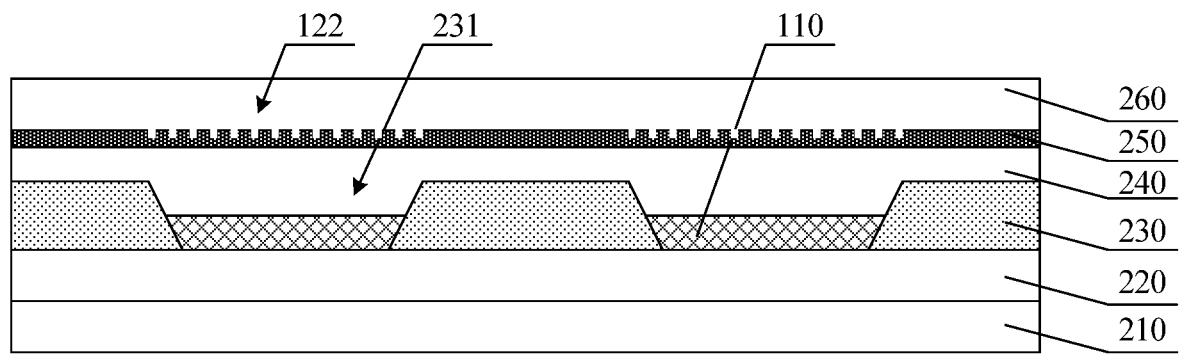
FIG. 11 is a structural schematic diagram of still another display device provided in an embodiment of the present disclosure.
Figure 12:
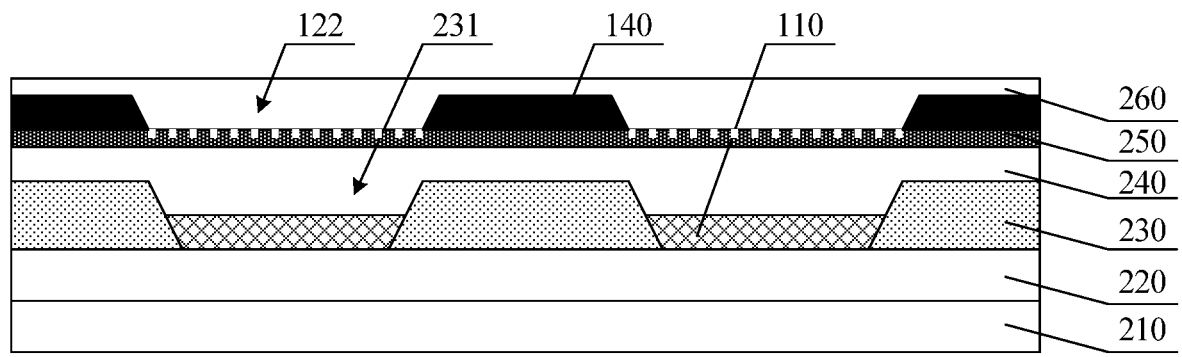
FIG. 12 is a structural schematic diagram of still another display device provided in an embodiment of the present disclosure.
Figure 13:
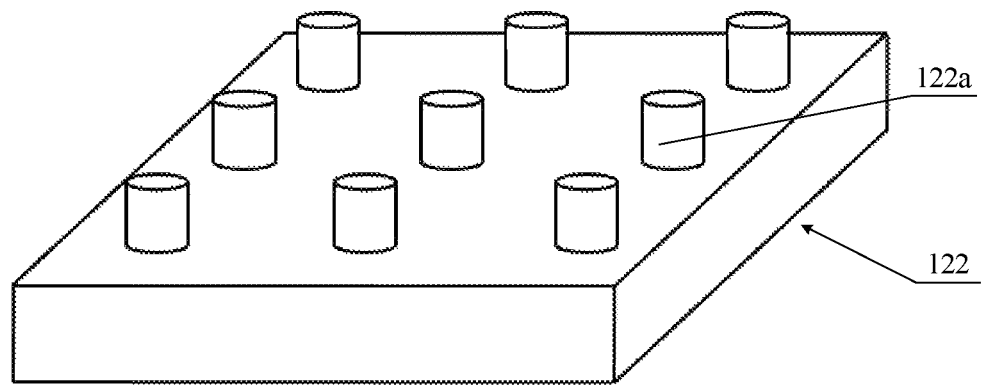
FIG. 13 is a structural schematic diagram of a photonic crystal pattern of a display device provided in an embodiment of the present disclosure.
Figure 14:
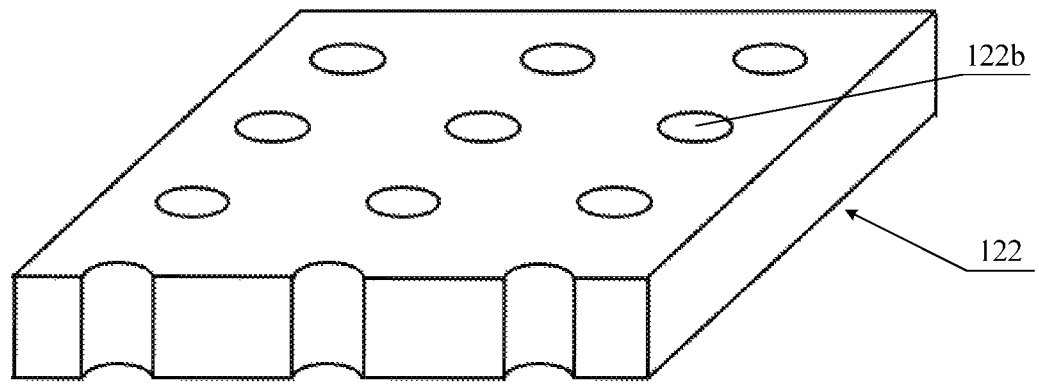
FIG. 14 is a structural schematic diagram of another photonic crystal pattern of a display device provided in an embodiment of the present disclosure.

Optionally, in the embodiments of the present disclosure, the photonic crystal patterns 122 may comprise convex pillar structures 122a, or may comprise concave pillar structures 122b. FIG. 11 is a structural schematic diagram of still another display device provided in an embodiment of the present disclosure; FIG. 12 is a structural schematic diagram of still another display device provided in an embodiment of the present disclosure; FIG. 13 is a structural schematic diagram of a photonic crystal pattern in a display device provided in an embodiment of the present disclosure; and FIG. 14 a structural schematic diagram of another photonic crystal pattern in a display device provided in an embodiment of the present disclosure. Reference is made to FIG. 9 to FIG. 12, in the display devices as shown in FIG. 9 to FIG. 10, all the photonic crystal patterns 122 comprise convex pillar structures 122a as shown in FIG. 13, and in the display devices as shown in FIG. 11 and FIG. 12, all the photonic crystal patterns 122 comprise concave pillar structures 122b as shown in FIG. 14. Here, the structure of the display device as shown in FIG. 12 is the same as the structure of the display device as shown in FIG. 11, except that a black matrix 140 is added on the basis of the display devices as shown in FIG. 11. It should be noted that in the embodiments of the present disclosure, the size of and the spacing between the photonic crystal patterns 122 are usually on the order of nanometer, for example, less than 500 nm.

Based on the display devices provided in the various embodiments above of the present disclosure, the embodiments of the present disclosure further provide a method for manufacturing a display device. The method for manufacturing a display device is used for manufacturing the display device provided in any embodiment above of the present disclosure.

Figure 15:
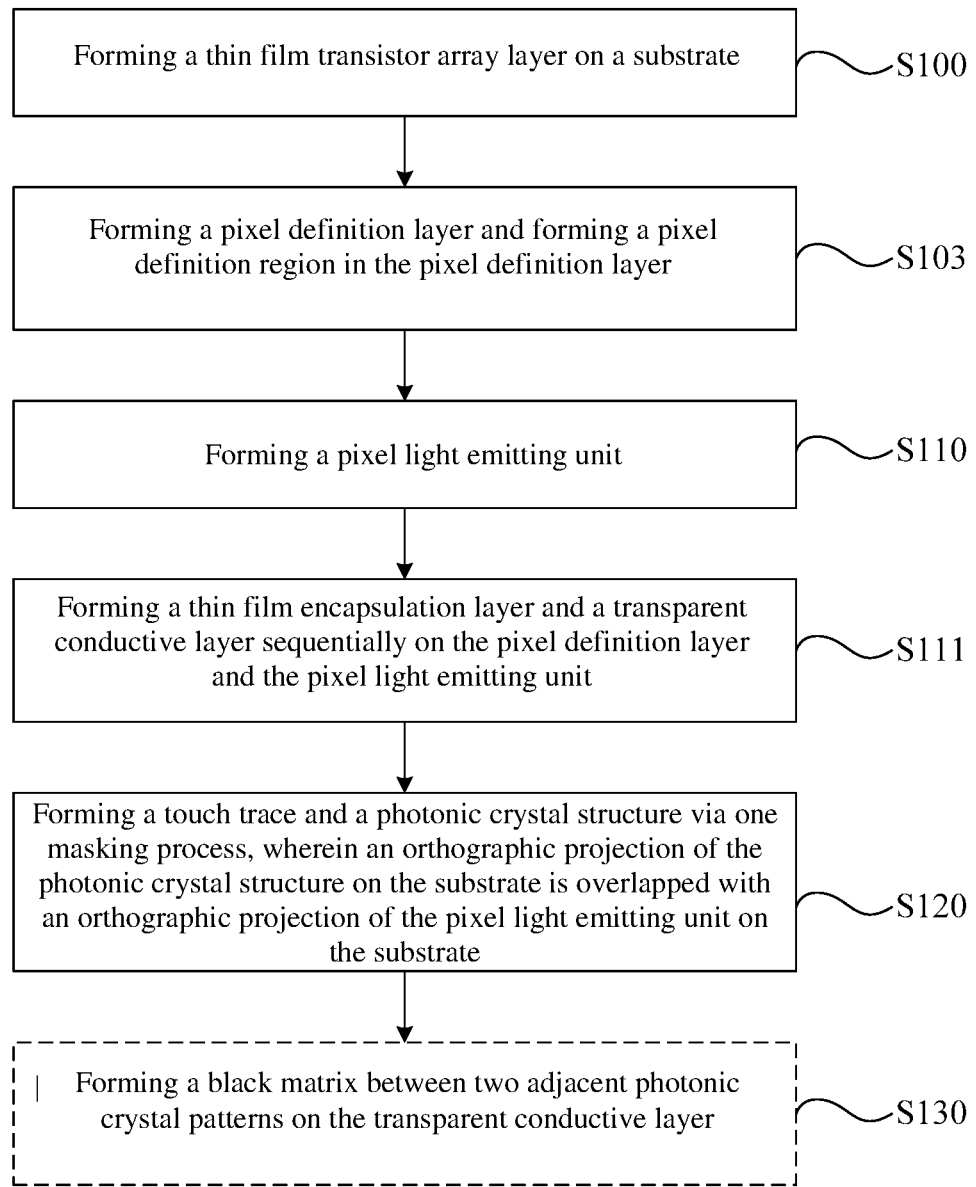
FIG. 15 is a flow chart of a method for manufacturing a display device provided in an embodiment of the present disclosure.

FIG. 15 is a flow chart of a method for manufacturing a display device provided in an embodiment of the present disclosure. The method provided in the embodiment may be applied in a process for manufacturing a display device. The method provided in the embodiment of the present disclosure may comprise the following steps.

S110: forming a pixel light emitting unit.

In practical application, before forming the pixel light emitting unit, the embodiment of the present disclosure may further comprise:

S100: forming a thin film transistor array layer on a substrate; and

S103: forming a pixel definition layer and forming a pixel definition region in the pixel definition layer; wherein the pixel light emitting unit is to be formed in the pixel definition region.

In the embodiments of the present disclosure, reference may be made to the display device provided in the embodiment as shown in FIG. 1. FIG. 1 shows a sectional view of the manufacture procedure, in which forming the pixel definition region in the pixel definition layer may comprise exposing the pixel definition layer by using a masking process to form pixel definition regions. After forming the pixel definition regions, a pixel light emitting unit may be formed in each of the pixel definition regions. As shown in FIG. 9, in the embodiments of the present disclosure, the pixel light emitting unit may also comprise a first electrode layer, an organic light emitting layer and a second electrode layer. The layers of the pixel light emitting unit may be formed by different process procedures, which will be illustrated with reference to several optional embodiments below.

S120: forming a touch trace and a photonic crystal structure via one masking process, wherein an orthographic projection of the photonic crystal structure on the substrate is overlapped with an orthographic projection of the pixel light emitting unit on the substrate.

In practical application, before forming the touch trace and the photonic crystal structure, the embodiment of the present disclosure may further comprise:

S111: forming a thin film encapsulation layer and a transparent conductive layer sequentially on the pixel definition layer and the pixel light emitting unit; wherein both the touch trace and the photonic crystal structure will be formed on the transparent conductive layer.

Figure 16:
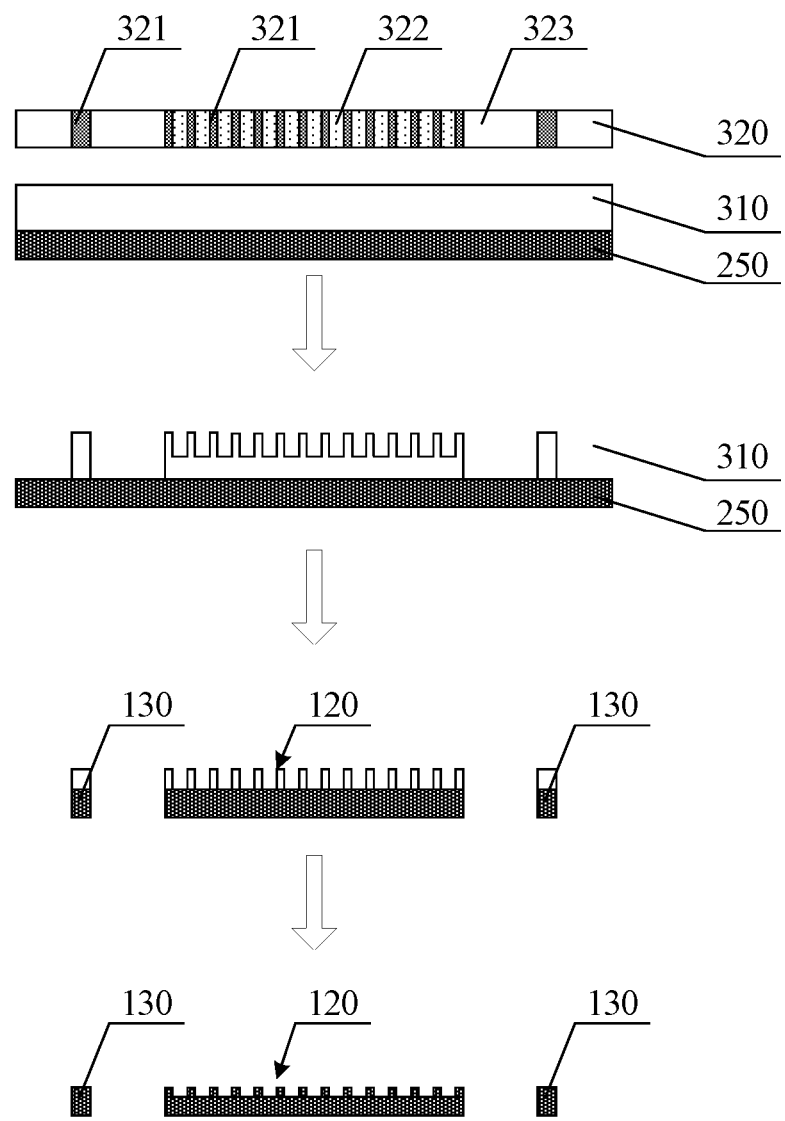
FIG. 16 is a schematic diagram showing a process of a method for manufacturing a display device provided in an embodiment of the present disclosure.

In the embodiments of the present disclosure, the masking process for forming the touch trace and the photonic crystal structure may be as shown in FIG. 16. The process comprises: applying a layer of photoresist 310 on a transparent conductive layer 250; and subjecting the photoresist 310 to step exposure and development using a grey tone masking plate 320. Herein, an unexposed region having a photoresist with a first thickness, corresponding to the opaque region 321 of the grey tone masking plate 320, is formed at positions of the touch trace 130 and the convex pillar structures of the photonic crystal structure 120 (FIG. 16 shows an example in which the photonic crystal pattern 122 of the photonic crystal structure 120 has a structure as shown in FIG. 13); a partially exposed region having a photoresist with a second thickness, corresponding to the partially transparent region 322 of the grey tone masking plate 320, is formed in the photonic crystal structure 120 at positions other than those of the convex pillar structures, wherein the first thickness is greater than the second thickness; a completely exposed region without photoresist, corresponding to the completely transparent region 323 of the grey tone masking plate 320, is formed in the transparent conductive layer 250 at positions other than those of the touch trace 130 and the photonic crystal structure 120. The transparent conductive layer 250 in the completely exposed region is subjected to a first etching to form the touch trace 130 and the photonic crystal structure 120; then, the photoresist 310 is subjected to an ashing treatment to wholly remove the photoresist 310 with the second thickness, so as to expose the transparent conductive layer 250 in the partially exposed region; a part thickness of the transparent conductive layer 250 in the partially exposed region is etched off by a second etching process; and the remaining photoresist 310 is stripped off, to form the convex pillar structures of the photonic crystal structure 120. As seen from the above process, the touch trace 130 and the photonic crystal structure 120 are formed by subjecting the transparent conductive layer 250 to one masking process, and an orthographic projection of the photonic crystal structure 120 on the substrate is overlapped with an orthographic projection of the pixel light emitting unit 110 on the substrate.

In the method for manufacturing a display device provided in the embodiments of the present disclosure, the color film function layer (i.e., the photonic crystal structure) and the touch trace may be manufactured in one manufacture procedure. As such, multiple manufacture procedures required for manufacturing the color film function layer and the touch trace on an organic EL layer can be avoided, and the possibility of damaging the organic EL layer by the manufacture procedure can be effectively reduced, thereby obtaining a relatively high product yield. In addition, the touch trace and the color film function layer (i.e., the photonic crystal structure) are provided in the same layer (i.e., in the transparent conductive layer). As such, the thickness of the overall module can be effectively reduced, and the weight of the display device can be reduced, thereby increasing the market competitiveness of the display device.

Optionally, the method provided in the embodiments of the present disclosure may further comprise:

S130: forming a black matrix between two adjacent photonic crystal patterns on the transparent conductive layer.

Reference is made to the display devices as shown in FIG. 10 and FIG. 12. A black matrix is provided between two adjacent photonic crystal patterns in both figures. The black matrix can be used for avoiding a color mixing phenomenon between adjacent sub-pixels due to light leakage.

In the above embodiments of the present disclosure, it has been described that the layers of the pixel light emitting unit may be formed by different process procedures. This will be described with reference to several optional embodiments below.

In a process in the embodiments of the present disclosure, the implementation for forming the pixel light emitting unit in the pixel definition region may comprise: depositing a first electrode thin film, an organic light emitting thin film and a second electrode thin film sequentially; applying a layer of photoresist on the second electrode thin film; subjecting the photoresist to exposure and development; then performing an etching with an etching process, to form a first electrode layer, an organic light emitting layer and a second electrode layer in respective pixel definition regions.

Figure 17:
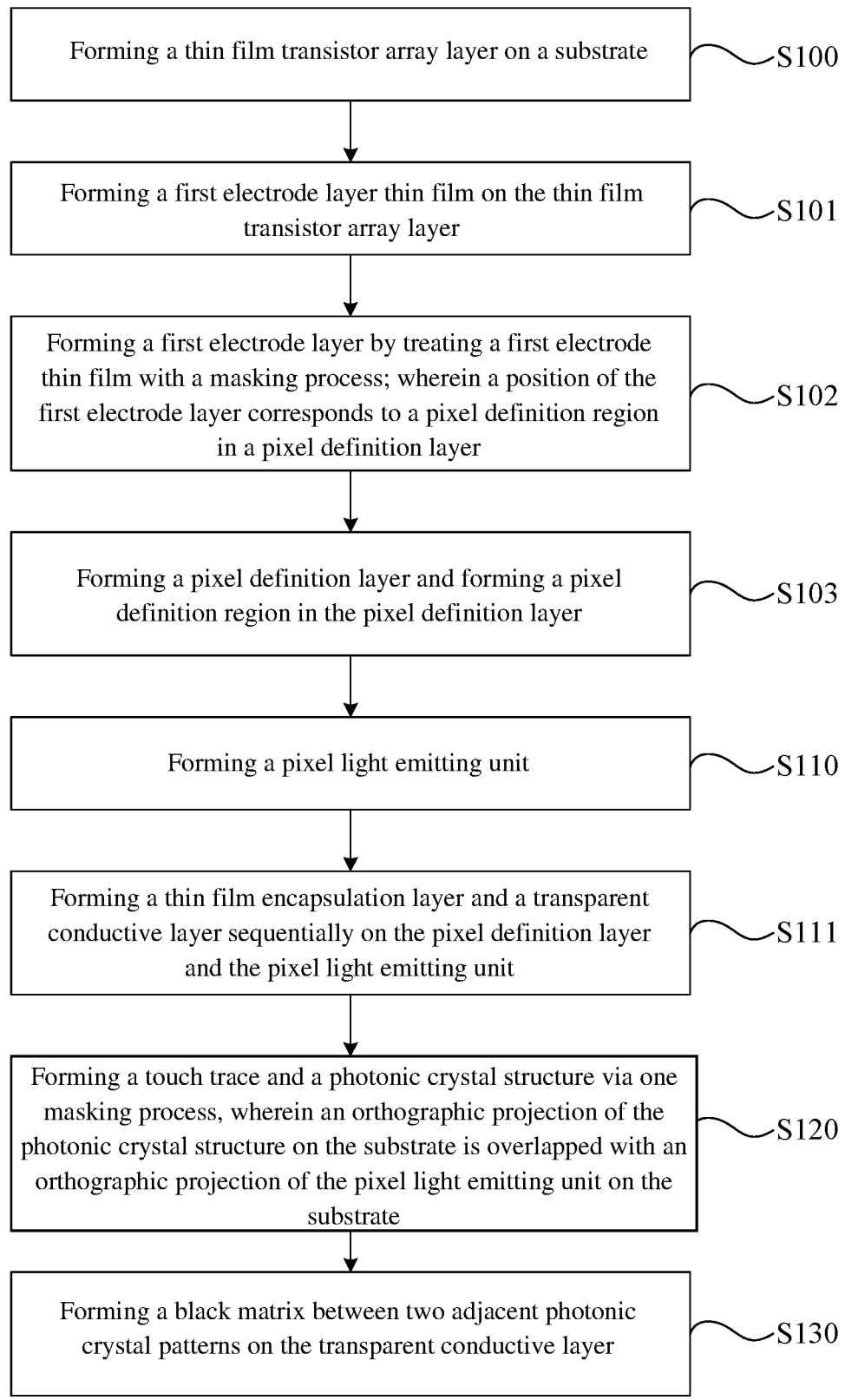
FIG. 17 is a flow chart of another method for manufacturing a display device provided in an embodiment of the present disclosure.

In another process in the embodiments of the present embodiment, a flow chart of another method for manufacturing a display device provided in an embodiment of the present disclosure is shown in FIG. 17, which is on the basis of the flow chart as shown in FIG. 15, and may further comprise, before S103, the following step:

S101: forming a first electrode thin film on the thin film transistor array layer.

In the embodiments of the present disclosure, the implementation for forming the pixel light emitting unit in the pixel definition region may comprise: forming an organic light emitting layer and a second electrode layer in the pixel definition region.

In the embodiments of the present disclosure, a first electrode thin film may be deposited before applying the pixel definition layer, and then the pixel definition layer may be applied. The pixel definition layer encapsulates the edges of the first electrode thin film. The pixel definition region in the pixel definition layer is formed by a masking process. The first electrode thin film at the position of the pixel definition region is required to be remained when forming the pixel definition region. Therefore, when forming the pixel light emitting unit, only the organic light emitting layer and the second electrode layer are required to be deposited.

It should be noted that in the embodiments of the present disclosure, the light emitting principle of the pixel light emitting unit is that photons are emitted from the organic light emitting layer, reflected by the first electrode layer, and then output from the second electrode layer. It can be known from the process provided in the embodiments of the present disclosure that although a layer of the first electrode thin film is deposited on the thin film transistor array layer, and the organic light emitting layer and the second electrode layer are deposited on both the pixel definition layer and the pixel definition region, a complete composite structure of the first electrode layer, the organic light emitting layer and the second electrode layer is only present at the position of the pixel definition region. Therefore, in the embodiments of the present disclosure, the pixel light emitting unit is only provided in the above pixel definition region.

Optionally, in the embodiments of the present disclosure, before S103, the method may further comprise:

S102: forming a first electrode layer by treating a first electrode thin film with a masking process; wherein a position of the first electrode layer corresponds to a pixel definition region in a pixel definition layer.

In the embodiments of the present disclosure, before applying the pixel definition layer, the first electrode thin film may be subjected to a masking process, to form the first electrode layer. The process may allow the first electrode layer to be remained only in the pixel definition region. Similarly, after depositing the organic light emitting thin film and the second electrode thin film on the pixel definition layer, only the organic light emitting layer and the second electrode layer in the pixel definition region may be remained also by performing a treatment with a masking process.

Optionally, in the embodiments of the present disclosure, the photonic crystal structure in the transparent conductive layer comprises periodically arranged photonic crystal units, each of which has different photonic crystal patterns, wherein each of the photonic crystal patterns is used to form a monochromatic light in a specific wavelength range after a light emitted from the pixel light emitting unit passes through the photonic crystal pattern. Reference may be made to the different photonic crystal patterns as shown in FIG. 2. FIG. 2 illustrates an example in which each photonic crystal unit comprises three kinds of different photonic crystal patterns which are used for achieving the function of RGB layer.

In addition, in the embodiments of the present disclosure, the photonic crystal patterns in each of the photonic crystal units may comprise convex pillar structures or concave pillar structures arranged in different periods.

Optionally, in the embodiments of the present disclosure, the touch trace is provided around the photonic crystal unit(s) or a plurality of the photonic crystal patterns. With reference to FIG. 2 and FIG. 6 to FIG. 8, the touch trace may be provided around one or more photonic crystal units or around a plurality of photonic crystal patterns in different configurations. Any configuration, as long as the touch trace is provided in the transparent conductive layer (i.e., in the same layer as the photonic crystal structure for achieving the function of color film layer) and can accurately identify touch operations of a user, can be used for the touch trace in the embodiments of the present disclosure.

Although the embodiments of the present disclosure are illustrated as above, the contents described are only for the convenience of understanding the present invention, but not intended to limit the present invention. One skilled in the art can make any modification or change on the forms and details of the embodiments without departing from the spirit and scope of the present disclosure. The protection scope of the present invention is defined by the appended claims.

What is claimed is:

1. A display device comprising:
   a touch trace and a photonic crystal structure provided in a common layer,
   wherein an orthographic projection of the photonic crystal structure on a substrate is overlapped with an orthographic projection of a pixel light emitting unit on the substrate;
   wherein the photonic crystal structure comprises periodically arranged photonic crystal units;
   wherein at least one photonic crystal unit comprises a plurality of different photonic crystal patterns; and
   wherein the photonic crystal patterns are configured such that at least one photonic crystal pattern forms a monochromatic light in a specific wavelength range upon a light emitted from the pixel light emitting unit passing through the at least one photonic crystal pattern.

2. The display device according to claim 1, wherein the photonic crystal patterns in the at least one photonic crystal unit comprise convex pillar structures or concave pillar structures arranged in different periods.

3. The display device according to claim 1, wherein the at least one photonic crystal unit has three kinds of photonic crystal patterns with different patterns for forming monochromatic lights with a red color, a green color and a blue color respectively.

4. The display device according to claim 1, wherein the touch trace is provided around one or more photonic crystal units or around a plurality of photonic crystal patterns.

5. The display device according to claim 4, wherein the touch trace is provided around each of the photonic crystal units.

6. The display device according to claim 4, wherein the touch trace is provided around a plurality of photonic crystal units arranged transversely.

7. The display device according to claim 4, wherein the touch trace is provided around a plurality of photonic crystal units arranged vertically.

8. The display device according to claim 4, wherein the touch trace is provided around n photonic crystal units arranged vertically, and around n rows*m columns of photonic crystal patterns, and n is greater than or equal to 2.

9. The display device according to claim 1, wherein the pixel light emitting unit comprises a first electrode layer, an organic light emitting layer and a second electrode layer arranged in this order.

10. The display device according to claim 1, wherein the touch trace and the photonic crystal structure are positioned in a transparent conductive layer, and the transparent conductive layer is on a side of the pixel light emitting unit away from the substrate.

11. The display device according to claim 10, wherein a black matrix is provided on a side of the transparent conductive layer away from the substrate, said black matrix being positioned between two adjacent photonic crystal patterns.

12. The display device according to claim 10, wherein the pixel light emitting unit is positioned in a pixel definition layer, and a thin film encapsulation layer is provided between the pixel definition layer and the transparent conductive layer.

13. The display device according to claim 1, wherein the display device is a top emitting touch display.

14. The display device according to claim 1, wherein the at least one photonic crystal unit is a pixel, the at least one photonic crystal pattern is a sub-pixel, and the at least one photonic crystal pattern and the at least one pixel light emitting unit are in a one to one correspondence.

15. The display device according to claim 1, wherein the display device comprises:
   a thin film transistor array layer on the substrate;
   a pixel definition layer on a side of the thin film transistor array layer away from the substrate;
   a thin film encapsulation layer on a side of the pixel definition layer away from the substrate;
   a transparent conductive layer on a side of the thin film encapsulation layer away from the substrate, wherein the touch trace and the photonic crystal structure are provided in the transparent conductive layer;
   a black matrix on a side of the transparent conductive layer away from the substrate, said black matrix being positioned between two adjacent photonic crystal patterns; and
   a protective layer on a side of the transparent conductive layer away from the substrate, covering the transparent conductive layer and the black matrix,
   wherein the pixel definition layer comprises a plurality of pixel definition regions, and at least one pixel definition region has one pixel light emitting unit formed therein, said one pixel light emitting unit comprising a first electrode layer, an organic light emitting layer and a second electrode layer arranged in this order.

16. A method for manufacturing a display device, comprising:
   forming a pixel light emitting unit on a substrate; and
   forming a touch trace and a photonic crystal structure via one masking process, wherein an orthographic projection of the photonic crystal structure on the substrate is overlapped with an orthographic projection of the pixel light emitting unit on the substrate,
   wherein the pixel light emitting unit is formed in a pixel definition layer, and said forming the touch trace and the photonic crystal structure via one masking process comprises:
      forming on the pixel definition layer with the pixel light emitting unit formed therein, a thin film encapsulation layer and a transparent conductive layer sequentially; and
      forming the touch trace and the photonic crystal structure by treating the transparent conductive layer via one masking treatment using a grey tone masking plate, wherein the touch trace is around one or more photonic crystal units or around a plurality of photonic crystal patterns in the photonic crystal structure.

17. The method according to claim 16, wherein the touch trace and the photonic crystal structure are formed on a transparent conductive layer, and the method further comprises:
   forming a black matrix on the transparent conductive layer, said black matrix being positioned between two adjacent photonic crystal patterns.

* * * * *